(12) United States Patent
Chen (10) Patent No.: US 11,994,922 B2
(45) Date of Patent: May 28, 2024

(54) WATER BLOCK MODULE, WATER BLOCK DEVICE AND WATER COOLING RADIATOR

(71) Applicant: Shenzhen Xunling Technology Co., Ltd., Shenzhen (CN)

(72) Inventor: Kang Chen, Shenzhen (CN)

(73) Assignee: SHENZHEN XUNLING TECHNOLOGY CO., LTD., Shenzhen (CN)

( * ) Notice: Subject to any disclaimer, the term of this patent is extended or adjusted under 35 U.S.C. 154(b) by 239 days.

(21) Appl. No.: 17/578,463

(22) Filed: Jan. 19, 2022

(65) Prior Publication Data

US 2023/0168726 A1 Jun. 1, 2023

(30) Foreign Application Priority Data

Dec. 1, 2021 (CN) .......................... 202122995412.1

(51) Int. Cl.
*F25B 21/02* (2006.01)
*G06F 1/20* (2006.01)
*H05K 7/20* (2006.01)

(52) U.S. Cl.
CPC ............. *G06F 1/206* (2013.01); *F25B 21/02* (2013.01); *H05K 7/20263* (2013.01); *F25B 2321/0252* (2013.01); *G06F 1/20* (2013.01); *G06F 2200/201* (2013.01); *H05K 7/20781* (2013.01)

(58) Field of Classification Search
CPC .. F25B 21/02; F25B 2321/0252; G06F 1/206; H05K 7/20263
See application file for complete search history.

(56) References Cited

U.S. PATENT DOCUMENTS

| 6,880,346 B1 * | 4/2005 | Tseng ..................... H10N 10/13 |
| | | 257/E23.099 |
| 2015/0059360 A1 * | 3/2015 | Lin ......................... F25B 21/02 |
| | | 165/104.31 |
| 2021/0123641 A1 * | 4/2021 | Monazami ............. H10N 10/00 |

* cited by examiner

*Primary Examiner* — Jonathan Bradford
(74) *Attorney, Agent, or Firm* — Andrew C. Cheng (57) ABSTRACT

A water block module includes a first water block and a refrigeration module. The first water block is provided with a first heat source surface in contact with a processor and a cold source surface in contact with the refrigeration module. A circulating water path is arranged in the first water block for circulating flow of external refrigeration liquid from the first heat source to the cold source surface so as to reduce the temperature of refrigeration liquid in the circulating water path. The circulating water path in the first water block flows through the first heat source surface, so as to absorb and carry away the heat, thereby achieving the purpose of reducing the temperature of the processor. The refrigeration module is arranged on the cold source surface of the first water block, so that the circulating water path absorbs the heat from the first heat source surface.

9 Claims, 7 Drawing Sheets

WATER BLOCK MODULE, WATER BLOCK DEVICE AND WATER COOLING RADIATOR

TECHNICAL FIELD

The present disclosure belongs to the technical field of radiators, and particularly relates to a water block module, a water block device and a water cooling radiator.

BACKGROUND

When a computer is used, there will be high temperature in a host box, which is a big enemy of an integrated circuit. High temperature will not only lead to unstable operation of a system, shorten the service life, but also may burn some components. The function of a radiator is to absorb the heat and ensure proper temperature of the computer components. Radiators may be classified into types of air cooling, heat pipe, water cooling, semiconductor refrigeration, compressor refrigeration, etc. according to the way of heat dissipation. The water cooling radiator means that cooling liquid is driven by a water pump to forcibly circulate heat away from the radiator, and has the advantages of quietness, stable temperature reduction, less dependence on the environment, etc. than the air cooling radiator.

However, the existing water cooling radiator includes a water block and a water drain. A water path in the water block and a water path in the water drain are connected in series, so that a water pump in the water block drives the flow of refrigeration liquid in both bodies, thereby reducing the temperature of a Central Processing Unit (CPU). However, the existing water pump can drive a limited flow of cooling liquid, which easily leads to a poor heat dissipation effect of the water cooling radiator.

SUMMARY

An object of the present disclosure is to provide a solution to the technical problem of poor heat dissipation effect of a water cooling radiator in the prior art.

The present disclosure is realized as follows:

A water block module includes a first water block and a refrigeration module arranged on the first water block. The first water block is provided with a first heat source surface in contact with a processor and a cold source surface in contact with the refrigeration module. A circulating water path is arranged in the first water block for circulating flow of external refrigeration liquid from the first heat source to the cold source surface so as to reduce the temperature of refrigeration liquid in the circulating water path.

Further, the first water block includes a central bracket, and a first water pump and a second water pump rotatably connected to the central bracket, the first water pump is configured to make the external refrigeration liquid flow from the first heat source surface to the cold source surface along the circulating water path, and the second water pump is configured to output the refrigeration liquid in the circulating water path to the outside of the first water block.

Further, the central bracket is provided with an accommodating cavity, the central bracket includes a separation bracket, the separation bracket is arranged in the accommodating cavity for separating the accommodating cavity into a first cavity and a second cavity, the first cavity is configured to accommodate the first water pump, the second cavity is configured to accommodate the second water pump, and the circulating water path transmits the refrigeration liquid flowing into the first cavity to the second cavity.

Further, the central bracket is provided with a water inlet bin and a first heat exchange module for closing the water inlet bin, the first heat exchange module is connected to the central bracket, the water inlet bin is communicated with the first cavity, the first heat source surface is arranged on a side of the first heat exchange module facing away from the central bracket, and the first heat source surface is configured to abut against the processor.

Further, the central bracket is further provided with a flowing bin communicated with the first cavity and a second heat exchange module for closing the flowing bin, the second heat exchange module is connected to the central bracket, the cold source surface is arranged on a side of the second heat exchange module away from the central bracket, and the refrigeration module abuts against the cold source surface.

Further, the central bracket is further provided with a first water outlet for communicating the second cavity and the flowing bin, the first water outlet is located in the flowing bin, and the central bracket is provided with a second water outlet communicated with the second cavity for outputting the refrigeration liquid in the first water block to the outside of the first water block.

Further, the refrigeration module is provided with a temperature control module for controlling a temperature value of the refrigeration module.

A water block device includes the above water block module and a second water block connected to the water block module. The second water block includes a second heat source surface. The refrigeration module includes a hot surface and a cold surface abutting against the cold source surface. The second heat source surface abuts against the hot surface for dissipating heat from the hot surface.

Further, the second water block is provided therein with a flowing water path through which refrigeration liquid in the second water block flows, and the flowing water path and the circulating water path are connected in series or in parallel.

Further, the above water block device, a first heat exchanger and a second heat exchanger are included. The first heat exchanger is communicated with the circulating water path, and the second heat exchanger is communicated with the flowing water path. The present disclosure has the following beneficial effects. The circulating water path in the first water block flows through the first heat source surface which absorbs heat generated during the operation of the processor, so as to absorb and carry away the heat, thereby achieving the purpose of reducing the temperature of the processor. The refrigeration module is arranged on the cold source surface of the first water block to reduce the temperature of the circulating water path, so that the circulating water path absorbs the heat from the first heat source surface. The temperature can be reduced by the refrigeration liquid of the circulating water path, and can also be further reduced by the refrigeration module arranged on the circulating water path, and the first water block can perform double temperature reduction on the absorbed heat, so as to quickly reduce the temperature of the processor and further improve the processing performance of the processor.

REFERENCE NUMERALS 1, water cooling radiator;
11, first heat source surface; 12, cold source surface; 13, central bracket; 131, accommodating cavity; 1311, first cavity; 1312, second cavity; 132, separation bracket; 1321, separation base; 1322, separation plate; 1323, groove; 1324, switching water tank; 1325, scaling plate; 133, water inlet bin; 134, longitudinal cavity; 135, first water inlet joint; 136, first water inlet; 137, second water inlet; 138, first water outlet; 139, flowing bin; 1391, boss; 1392, first water storage tank; 1393, second water storage tank;
14, first water pump; 141, first rotor cavity piece; 142, first stator; 143, first impeller; 144, first magnetic ring; 145, first axis piece; 146, first control module;
15, second water pump; 151, second rotor cavity piece; 152, second stator; 153, second impeller; 154, second magnetic ring; 155, second axis piece; 156, second control module;
16, first heat exchange module;
17, flow guide plate; 171, flow guide piece; 172, flow guide base plate;
18, housing; 181, assembly hole;
19, second heat exchange module;
100, first water outlet joint; 101, second water outlet;
2, refrigeration module; 21, cold surface; 22, hot surface;
3, water block device;
4, second water block; 41, second heat source surface; 42, second water inlet joint; 43, second water outlet joint;
5, first heat exchanger; 51, first water inlet pipe; 52, first water outlet pipe;
6, second heat exchanger; 61, second water inlet pipe; 62, second water outlet pipe.

DETAILED DESCRIPTION OF PREFERRED EMBODIMENTS

In order to make the objects, technical solutions and advantages of the present disclosure clearer, the present disclosure will be further described in detail below with reference to the accompanying drawings and embodiments. It should be understood that the specific embodiments described herein are illustrative only and are not intended to limit the present disclosure.

It should be noted that when an element is referred to as being "fixed" or "arranged" on another element, it may be directly on the other element or intervening elements may also be present. When an element is referred to as being "connected" to another element, it may be directly connected to the other element or intervening elements may also be present.

It should also be noted that the orientation terms left, right, up, down, etc. in the present embodiment are merely relative concepts or references to the normal use of products, and should not be construed as limiting.

Definitions: a first heat source surface 11 is a side of a first water block in contact with a processor; a second heat source surface 41 is a side of a second water block 4 in contact with a hot surface 22 of a refrigeration module 2; and a cold source surface 12 is a side of the first water block in contact with a cold surface 21 of the refrigeration module 2.

Figure 2:
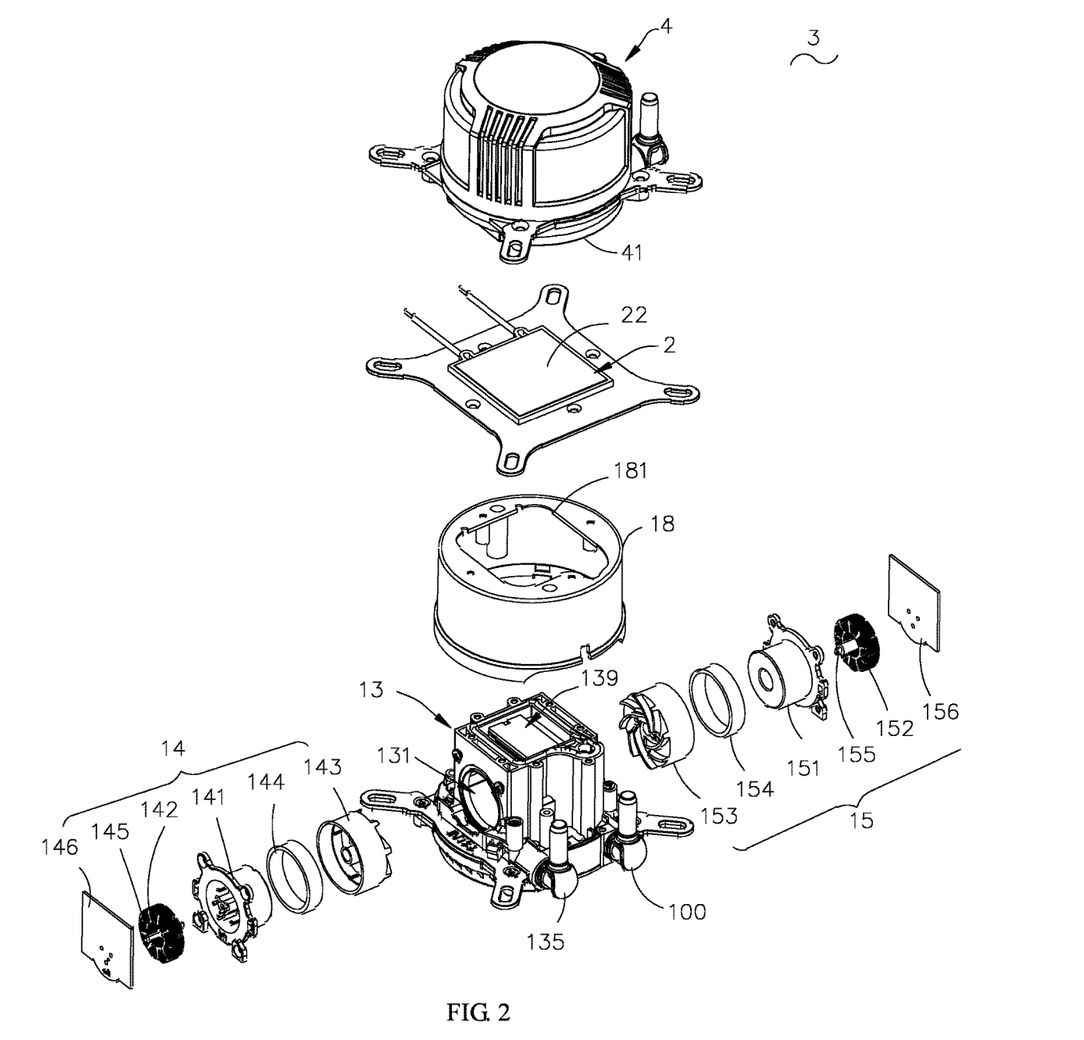
FIG. 2 is a first exploded view of a water block device provided in an embodiment of the present disclosure.
Figure 3:
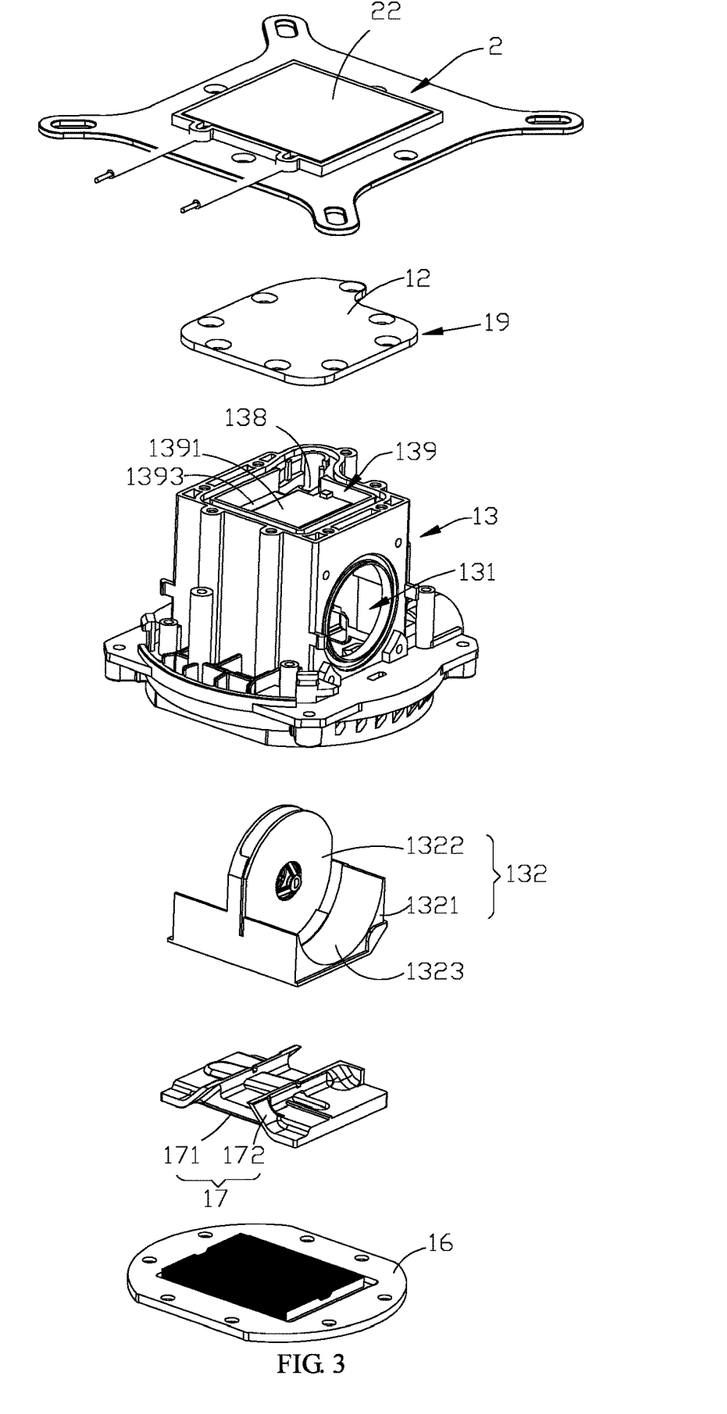
FIG. 3 is a first exploded view of a water block module provided in an embodiment of the present disclosure.
Figure 4:
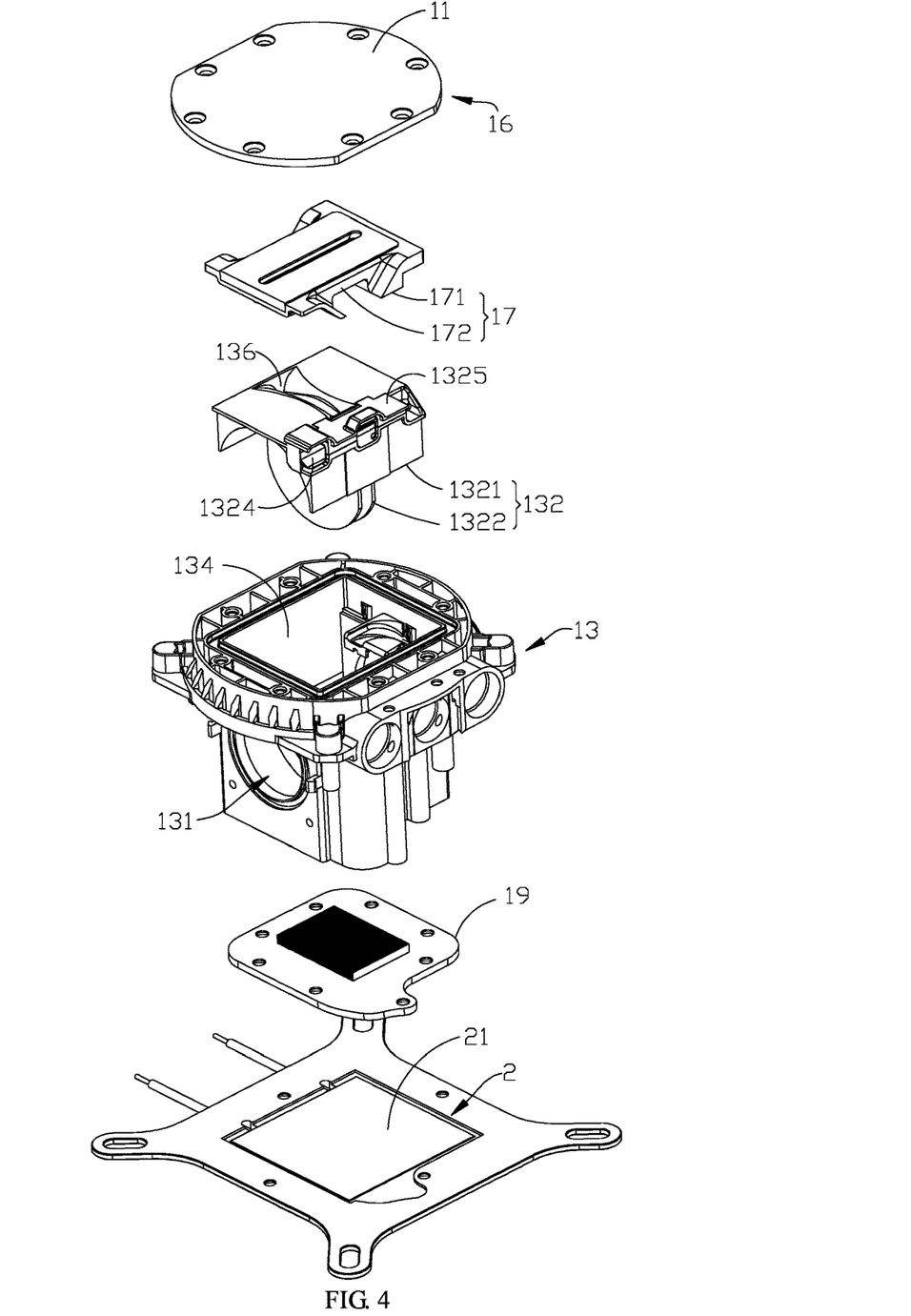
FIG. 4 is a second exploded view of a water block module provided in an embodiment of the present disclosure.

FIGS. 2 to 4 show a water block module provided in an embodiment of the present disclosure, which includes a first water block (not marked in the figure) and a refrigeration module 2 arranged on the first water block. The first water block is provided with a first heat source surface 11 in contact with a processor and a cold source surface 12 in contact with the refrigeration module 2. A circulating water path (not marked in the figure) is arranged in the first water block for circulating flow of external refrigeration liquid from the first heat source 11 to the cold source surface 12. The refrigeration module 2 is arranged on the cold source surface 12. The circulating water path in the first water block flows through the first heat source surface 11 which absorbs heat generated during the operation of the processor, so as to absorb and carry away the heat, thereby achieving the purpose of reducing the temperature of the processor. The refrigeration module 2 is arranged on the cold source surface 12 of the first water block to reduce the temperature of the circulating water path, so that the circulating water path absorbs the heat from the first heat source surface 11. The temperature can be reduced by the refrigeration liquid of the circulating water path, and can also be further reduced by the refrigeration module 2 arranged on the circulating water path, and the first water block can perform double temperature reduction on the absorbed heat, so as to quickly reduce the temperature of the processor and further improve the processing performance of the processor.

Specifically, the refrigeration module 2 is a semiconductor refrigeration sheet, also called a thermoelectric refrigeration sheet, which is a heat pump. The refrigeration module has the advantages of limitation in some space due to no sliding parts, high reliability, and no refrigerant contamination. By using the Peltier effect of a semiconductor material, when a direct current passes through a galvanic couple composed of two different semiconductor materials connected in series, heat can be absorbed and released at both ends of the galvanic couple, respectively, so that the purpose of refrigeration can be achieved. It is a refrigeration technology that produces negative thermal resistance, which is characterized by no moving parts and high reliability.

As shown in FIGS. 1 to 4, the first water block includes a central bracket 13, and a first water pump 14 and a second water pump 15 rotatably connected to the central bracket 13. The first water pump 14 is configured to make the external refrigeration liquid flow from the first heat source surface 11 to the cold source surface 12 along the circulating water path. With the first water pump 14, the external refrigeration liquid flows quickly along the circulating water path, so as to accelerate the fluidity of the refrigeration liquid in the first water block, and then accelerate the refrigeration liquid passing through the refrigeration module 2, so that the refrigeration liquid can maintain a low-temperature state under the action of the refrigeration module 2, so as to flow to the first heat source surface 11 for temperature reduction. The second water pump 15 is configured to output the refrigeration liquid flowing along the circulating water path to the cold source surface 12 to an external first heat exchanger 5. With the second water pump 15, the flowing of the refrigeration liquid flowing to the cold source surface 12 to the first heat source surface 11 is accelerated, and the refrigeration liquid is output to the external first heat exchanger 5. With the first water pump 14 and the second water pump 15, the fluidity of the refrigeration liquid in the first heat exchanger 5 and the circulating water path is accelerated to some extent, so as to improve the temperature reduction performance of the first water block.

As shown in FIGS. 2 to 4, the central bracket 13 is provided with an accommodating cavity 131 penetrating through the central bracket 13 along a width direction of the central bracket 13. The first water pump 14 and the second water pump 15 are arranged oppositely and are both located in the accommodating cavity 131. By the independent arrangement of the first water pump 14 and the second water pump 15, the first water pump 14 and the second water pump 15 are operated separately. The separate operation is advantageous in that even if one of the water pumps is damaged, the other water pump can operate the first water block to some extent.

As shown in FIGS. 2 to 4, the central bracket 13 includes a separation bracket 132. The separation bracket 132 is arranged in the accommodating cavity 131 for separating the accommodating cavity 131 into a first cavity 1311 and a second cavity 1312. The first cavity 1311 is configured to accommodate the first water pump 14, and the second cavity 1312 is configured to accommodate the second water pump 15. The first water pump 14 and the second water pump 15 are respectively arranged in the first cavity 1311 and the second cavity 1312, and the first water pump 14 and the second water pump 15 are further distinguished to reduce the occurrence of mutual interference between the first water pump 14 and the second water pump 15. The circulating water path transmits the refrigeration liquid flowing into the first cavity 1311 to the second cavity 1312.

As a specific embodiment, as shown in FIGS. 3 and 4, the separation bracket 132 includes a separation base 1321 and a separation plate 1322. The separation base 1321 is recessed to form a groove 1323 for accommodating the first water pump 14 and the second water pump 15. When the separation bracket 132 is fitted into the central bracket 13, the groove 1323 and the accommodating cavity 131 are spliced to form a cavity for accommodating the first water pump 14 and the second water pump 15, and the cavity is separated into the first cavity 1311 for accommodating the first water pump 14 and the second cavity 1312 for accommodating the second water pump 15 through the separation plate 1322.

As shown in FIG. 2, the first water pump 14 includes a first rotor cavity piece 141, a first stator 142, a first impeller 143, a first magnetic ring 144, and a first axis piece 145. The first rotor cavity piece 141 and the first impeller 143 both have an inner cavity. One end of the first axis piece 145 penetrates through the first stator 142, and the other end penetrates out of the first rotor cavity piece 141. An end of the first axis piece 145 penetrating out of the first rotor cavity piece 141 is connected to the first impeller 143. A first bearing is arranged between the first impeller 143 and the first axis piece 145, and the first bearing is sheathed on the first axis piece 145 so that the first impeller 143 and the first axis piece 145 can rotate relatively. The first magnetic ring 144 is sheathed on the first rotor cavity piece 141, and the first magnetic ring 144 is embedded in the first impeller 143, so that the first water pump 14 drives the first impeller 143 to rotate according to a magnetic field force generated by the first stator 142 and the first magnetic ring 144 under the condition of power-on. In addition, a first control module 146 is connected to a side of the central bracket 13, and the first control module 146 is electrically connected to the first rotor cavity piece 141 to control the operation state of the first water pump 14 according to the user's requirements through the first control module 146.

The second water pump 15 includes a second rotor cavity piece 151, a second stator 152, a second impeller 153, a second magnetic ring 154, and a second axis piece 155. The second rotor cavity piece 151 and the second impeller 153 both have an inner cavity. One end of the second axis piece 155 penetrates through the second stator 152, and the other end penetrates out of the second rotor cavity piece 151. An end of the second axis piece 155 penetrating out of the second rotor cavity piece 151 is connected to the second impeller 153. A second bearing is arranged between the second impeller 153 and the second axis piece 155, and the second bearing is sheathed on the second axis piece 155 so that the second impeller 153 and the second axis piece 155 can rotate relatively. The second magnetic ring 154 is sheathed on the second rotor cavity piece 151, and the second magnetic ring 154 is embedded in the second impeller 153, so that the second water pump 15 drives the second impeller 153 to rotate according to a magnetic field force generated by the second stator 152 and the second magnetic ring 154 under the condition of power-on. In addition, a second control module 156 is connected to a side of the central bracket 13, and the second control module 156 is electrically connected to the second rotor cavity piece 151 to control the operation state of the second water pump 15 according to the user's requirements through the second control module 156.

In addition, the first water block further includes a housing 18. The housing 18 is configured to be hermetically connected to the central bracket 13, so that the above first water pump 14, second water pump 15 and circulating water path are all sealed inside the housing 18. The top of the housing 18 is provided with an assembly hole 181 so as to facilitate the abutment between a first heat dissipation module 16 and the refrigeration module 2.

Figure 5:
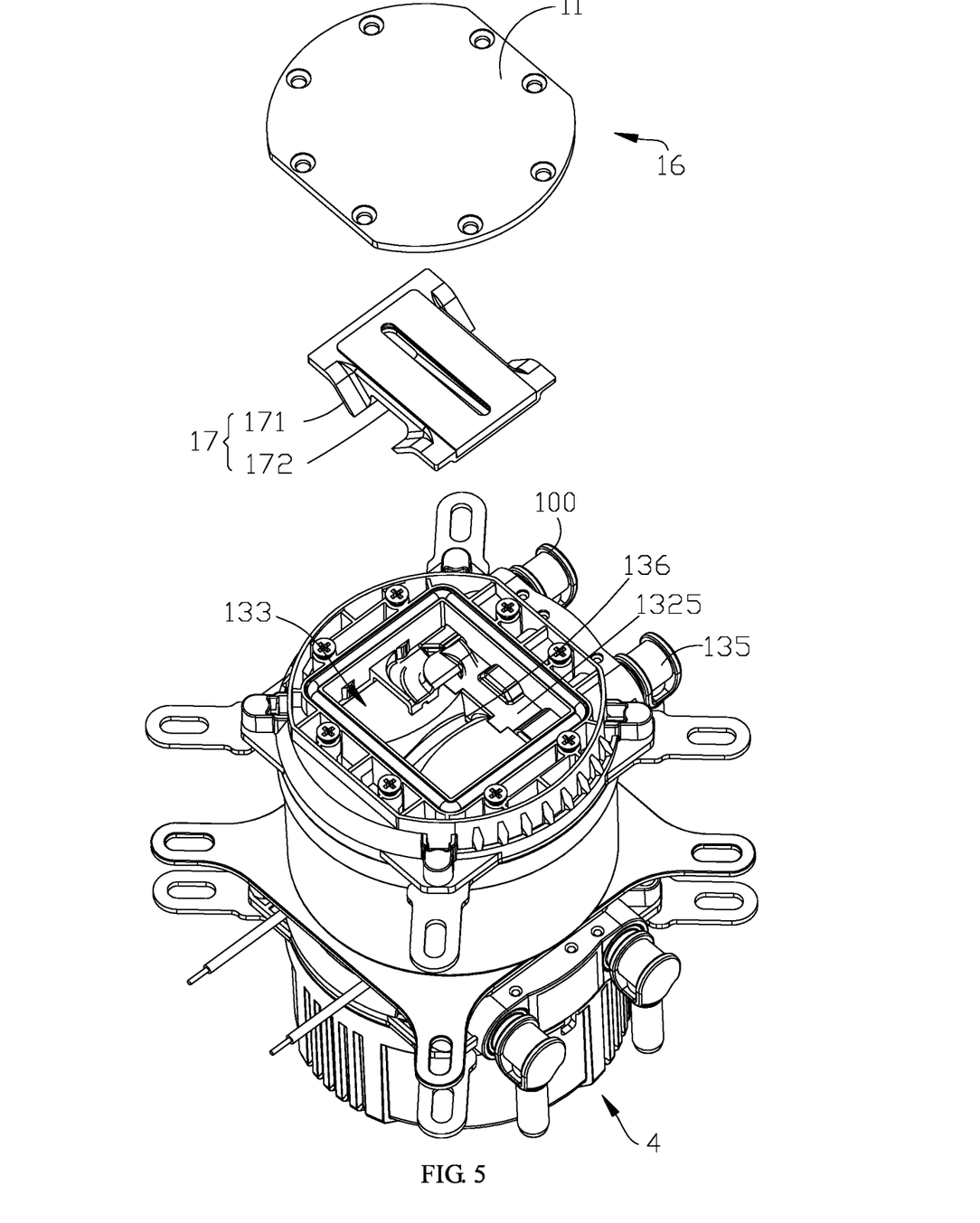
FIG. 5 is a second exploded view of a water block device provided in an embodiment of the present disclosure.
Figure 7:
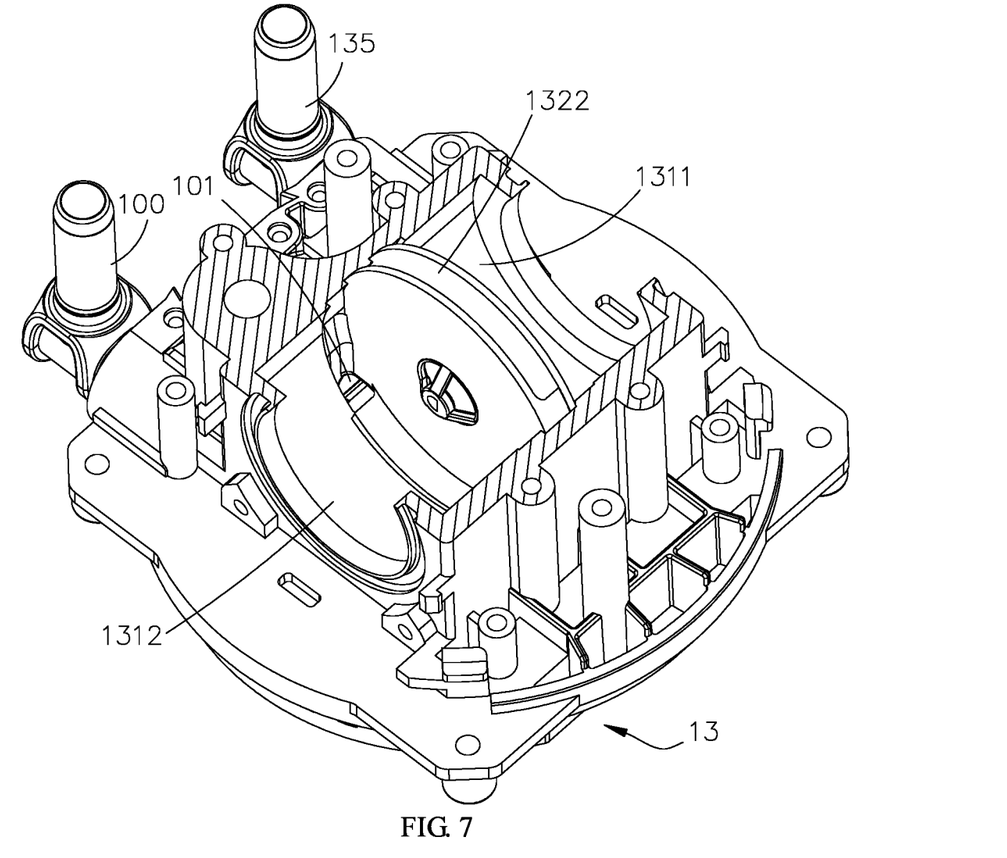
FIG. 7 is a partial cross-sectional view of a central bracket provided in an embodiment of the present disclosure.

As shown in FIGS. 4, 5 and 7, the central bracket 13 is provided with a water inlet bin 133 and a first heat exchange module 16 for closing the water inlet bin 133. The first heat exchange module 16 is connected to the central bracket 13, and the water inlet bin 133 is closed by the first heat exchange module 16, so that external refrigeration liquid can flow into the water inlet bin 133 and is difficult to overflow, thereby improving the stability of the first water block and reducing the occurrence of damage to the processor due to the leakage of the refrigeration liquid. In addition, with the water inlet bin 133, a certain water accumulation area is formed, so that the refrigeration liquid is continuously exchanged when entering the water inlet bin 133 with a limited volume. Thus, the refrigeration liquid reaching a certain temperature is pushed out of the water inlet bin 133 by the refrigeration liquid just entering the water inlet bin 133, thereby improving the temperature reduction performance of the first water block to a certain extent. The water inlet bin 133 is communicated with the first cavity 1311. The first heat source surface 11 is arranged on a side of the first heat exchange module 16 facing away from the central bracket 13, and the first heat source surface 11 abuts against the processor. By this arrangement, the refrigeration liquid can quickly take away heat absorbed by the first heat source surface 11 of the first heat exchange module 16, and the heat dissipation performance of the first water block can be improved.

As a specific embodiment, as shown in FIGS. 3, 4 and 7, a longitudinal cavity 134 is recessed in the central bracket 13. The longitudinal cavity 134 is arranged perpendicularly to and communicated with the above accommodation cavity

131. The separation base 1321 separates the longitudinal cavity 134 to form the above water inlet bin 133, and the water inlet bin 133 is closed by the first heat exchange module. In addition, a first water inlet joint 135 communicated with the water inlet bin 133 is connected to one side of the central bracket 13. The first water inlet joint 135 is configured to be connected to the external first heat exchanger 5 so that the refrigeration liquid in the first heat exchanger 5 flows to the first water block.

The first water block further includes a flow guide plate 17 arranged in the water inlet bin 133. The flow guide plate 17 is arranged between the first heat exchange module and the separation base 1321. The flow guide plate 17 includes two flow guide pieces 171 and a flow guide base plate 172. The two flow guide pieces 171 are arranged oppositely, and the two flow guide pieces 171 are inclined to each other. The mutually adjacent ends of the two flow guide pieces which are inclined to each other are arranged towards the separation base 1321, and the refrigeration liquid which is externally connected to the first water inlet joint 135 flows into the first cavity 1311 from the first water inlet joint 135 by the inclined arrangement of the flow guide pieces 171.

Figure 6:
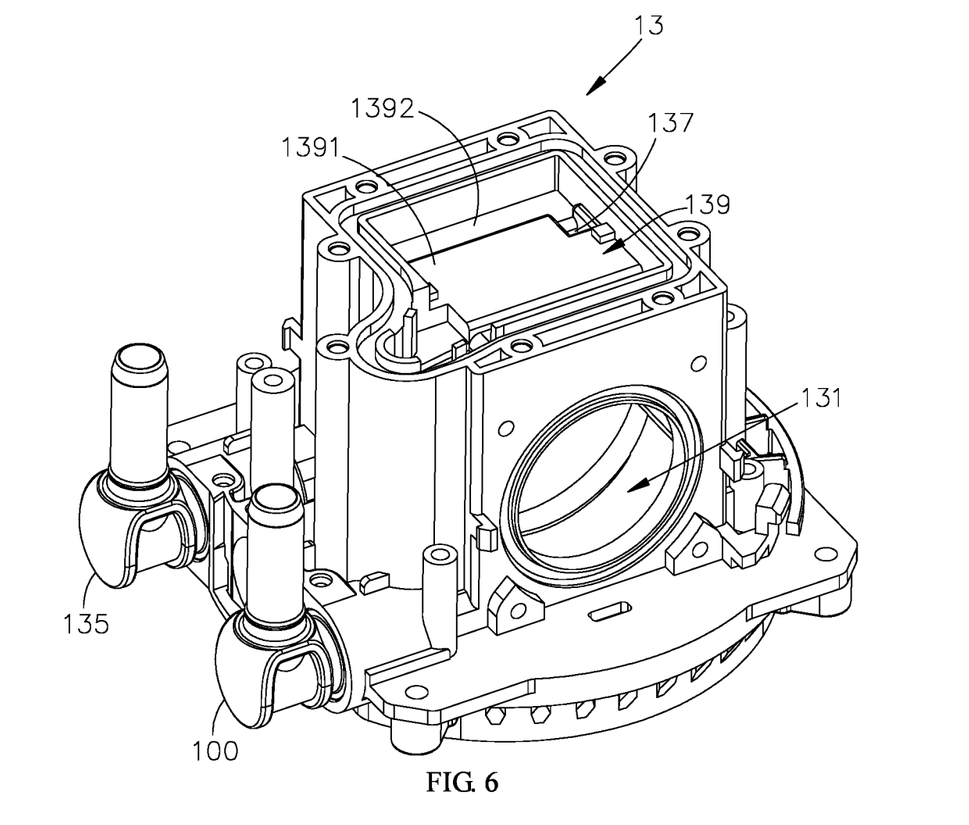
FIG. 6 is a perspective view of a central bracket provided in an embodiment of the present disclosure.

As shown in FIGS. 3, 6 and 7, the central bracket 13 is further provided with a flowing bin 139 communicated with the first cavity 1311 and a second heat exchange module 19 for closing the flowing bin 139. The second heat exchange module 19 is connected to the central bracket 13. With the flowing bin 139 communicated with the first cavity 1311, the flowing bin 139 is communicated with the water inlet bin 133, and with the second heat exchange module 19, the flowing bin 139 is closed, so that the second heat exchange module 19 performs a certain temperature reduction treatment on the refrigeration liquid flowing into the flowing bin 139. The cold source surface 12 is arranged on a side of the second heat exchange module 19 away from the central bracket 13. The refrigeration module 2 abuts against the cold source surface 12, and by arranging the refrigeration module 2 on the cold source surface 12 of the second heat exchange module 19, the temperature of the refrigeration liquid flowing into the flowing bin 139 is quickly reduced under the cooling of the refrigeration module, thereby further improving the temperature reduction performance of the first water block.

As a specific embodiment, as shown in FIGS. 1, 4, 5 and 7, the separation base 1321 is provided with a first water inlet 136 communicated with the first cavity 1311. The first water inlet 136 is provided below the first water pump 14. The central bracket 13 is further provided with a second water inlet 137 opposite to the first water inlet 136. The second water inlet 137 is communicated with the flowing bin 139. The above arrangement facilitates the first impeller 143 to quickly drive the refrigeration liquid flowing from the first water inlet 136 to the second water inlet 137 and flowing from the second water inlet 137 into the flowing bin 139 during operation. Specifically, the flowing bin 139 is recessed in a top end of the central bracket 13, the flowing bin 139 is opposite to the water inlet bin 133, and the second water inlet 137 is provided on the flowing bin 139. The refrigeration liquid flows into the water inlet bin 133 from the external first heat exchanger 5 through the first water inlet 136, flows into the first cavity 1311 from the water inlet bin 133 through the first water inlet 136, and then is conveyed to the flowing bin 139 through the second water inlet 137 by the first water pump 14.

As shown in FIGS. 3 and 7, the central bracket 13 is further provided with a first water outlet 138. The first water outlet 138 is configured to communicate the second cavity 1312 and the flowing bin 139, and the first water outlet 138 is located in the flowing bin 139. By arranging the first water outlet 138 in the flowing cabin 139, the refrigeration liquid flowing into the flowing cabin 139 from the second water inlet 137 can flow from the first water outlet 138 to the second cavity 1312, and the circulating water path is realized so as to maximize the temperature reduction performance of the first water block. The first water outlet 138 and the second water inlet 137 are arranged diagonally. By this arrangement, a flowing distance of the refrigeration liquid flowing from the second water inlet 137 to the first water outlet 138 is increased to a certain extent, so that the refrigeration module 2 can reduce the temperature of the refrigeration liquid to a maximum extent. The central bracket 13 is provided with a second water outlet 101 communicated with the second cavity 1312. The second water outlet 101 is configured to be connected to the external first heat exchanger 5.

As a specific embodiment, as shown in FIGS. 3, 4 and 6, a boss 1391 is formed on the bottom of the flowing bin 139, the second water inlet 137 and the first water outlet 138 are respectively located at two sides of the boss 1391, and due to the arrangement of the boss 1391, a first water storage tank 1392 and a second water storage tank 1393 which are respectively distributed at two sides of the boss 1391 are formed. The first water storage tank 1392 is communicated with the second water inlet 137, and the second water storage tank 1393 is communicated with the first water outlet 138. When the refrigeration liquid flows into the first water storage tank 1392 from the second water inlet 137, the refrigeration liquid flows to the second water storage tank 1393 through the boss 1391 until the first water storage tank 1392 is filled with the refrigeration liquid. Therefore, the arrangement of the above boss 1391 maximizes the flow stroke of the refrigeration liquid flowing into the flowing cabin 139, thereby facilitating the temperature reduction treatment of the refrigeration module 2. As a specific embodiment, a first water outlet joint 100 is communicated with the central bracket 13. The first water outlet joint 100 is arranged in parallel with the first water inlet joint 135 to facilitate spatial arrangement during later mounting. The first water outlet joint 100 is externally connected to the first heat exchanger 5. A switching water tank 1324 is recessed in a side of the separation base 1321 away from the accommodation cavity 131, and a sealing plate 1325 is hermetically connected to the switching water tank 1324 so as to form a switching water path after the switching water tank 1324 is sealed by the sealing plate 1325. One end of the switching water path is communicated with the second water outlet 101, and the other end is communicated with the first water outlet joint 100 so as to realize the circulating water path.

As shown in FIGS. 1 to 7, the circulating water path is the first water inlet joint 135, the water inlet bin 133, the first water inlet 136, the first cavity 1311, the second water inlet 137, the flowing bin 139, the first water outlet 138, the switching water path and the first water outlet joint 100 through which the refrigeration liquid passes successively. The first heat source surface 11 of the first heat exchange module 16 in the above water inlet bin 133 for closing the water inlet bin 133 is in contact with the processor so as to absorb heat generated by the processor, cold refrigeration liquid and hot refrigeration liquid are exchanged by the above circulating water path, and then the temperature of the processor is reduced. In addition, the temperature reduction performance of the water block module is further improved by reducing the temperature of the refrigeration liquid flowing in the circulating water path by the refrigeration module 2 arranged in the flowing cabin 139.

As a specific example, the cold source surface 12 is provided with a radiator, which may be a fan or a water block. The radiator is located between the refrigeration module 2 and the cold source surface 12. By arranging the radiator on the cold source surface 12, the temperature of the refrigeration liquid having absorbed heat is reduced, and then the temperature is further reduced by the refrigeration module 2. This arrangement facilitates quick temperature reduction of the refrigeration liquid.

The refrigeration module 2 is provided with a temperature control module. The temperature control module is arranged on the refrigeration module 2, so as to control a temperature value of the refrigeration module 2 according to an environment temperature of the refrigeration module, so as to reduce the occurrence of water beads condensed on the surface of the water block module due to an excessively low temperature, thereby effectively improving the stability of the water block module.

Specifically, as shown in FIGS. 3 and 4, the refrigeration module 2 includes a cold surface 21 and a hot surface 22. The cold surface 21 is in contact with the cold source surface 12. The hot surface 22 and the cold surface 21 are arranged oppositely on a side of the refrigeration module 2 facing away from the cold surface 21. The temperature control module may be arranged on the cold surface 21 or on the hot surface 22, and temperature limit values may be correspondingly adjusted according to temperature values of the cold surface 21 and the hot surface 22. When the refrigeration module 2 exceeds a limit value, the temperature control module performs temperature adjustment on the refrigeration module 2 so that the temperature values thereof do not exceed the temperature limit values.

FIGS. 2 and 3 show a water block device 3 provided in an embodiment of the present disclosure, which includes a water block module and a second water block 4 connected to the water block module. The second water block 4 may be detachably connected to the water block module or integrally formed with the water block module, and is specifically designed according to actual requirements. The second water block 4 may also be an air cooling radiator. The second water block 4 includes a second heat source surface 41. The refrigeration module 2 includes a hot surface 22 and a cold surface 21 abutting against the cold source surface 12. The second heat source surface 41 abuts against the hot surface 22. The second heat source surface 41 of the second water block 4 abuts against the hot surface 22 of the refrigeration module 2 so that the second water block 4 can quickly reduce the temperature of the refrigeration module 2. With the second water block 4, the refrigeration module 2 and the first water block, the temperature of the refrigeration module 2 in the water block device 3 can be reduced by the second water block 4. The refrigeration module 2 reduces the temperature of the first water block to achieve the purpose of quickly reducing the temperature of the processor by the water block device 3, thereby improving the quick temperature reduction performance of the water block device 3.

The second water block 4 is provided therein with a flowing water path through which refrigeration liquid in the second water block 4 flows, and the flowing water path and the circulating water path are connected in series. The flowing water path and the circulating water path may also be connected in parallel. By connecting the flowing water path and the circulating water path in series or in parallel, the temperature of the refrigeration liquid in the flowing water path can also be reduced by the refrigeration module 2, so as to further improve the temperature reduction performance of the water block module.

Specifically, the flowing water path is a flowing water path for the refrigeration liquid to flow in the second water block 4, and the flowing water path is externally connected to a second heat exchanger 6, so as to realize the circulating communication between the second water block 4 and the second heat exchanger 6.

Figure 1:
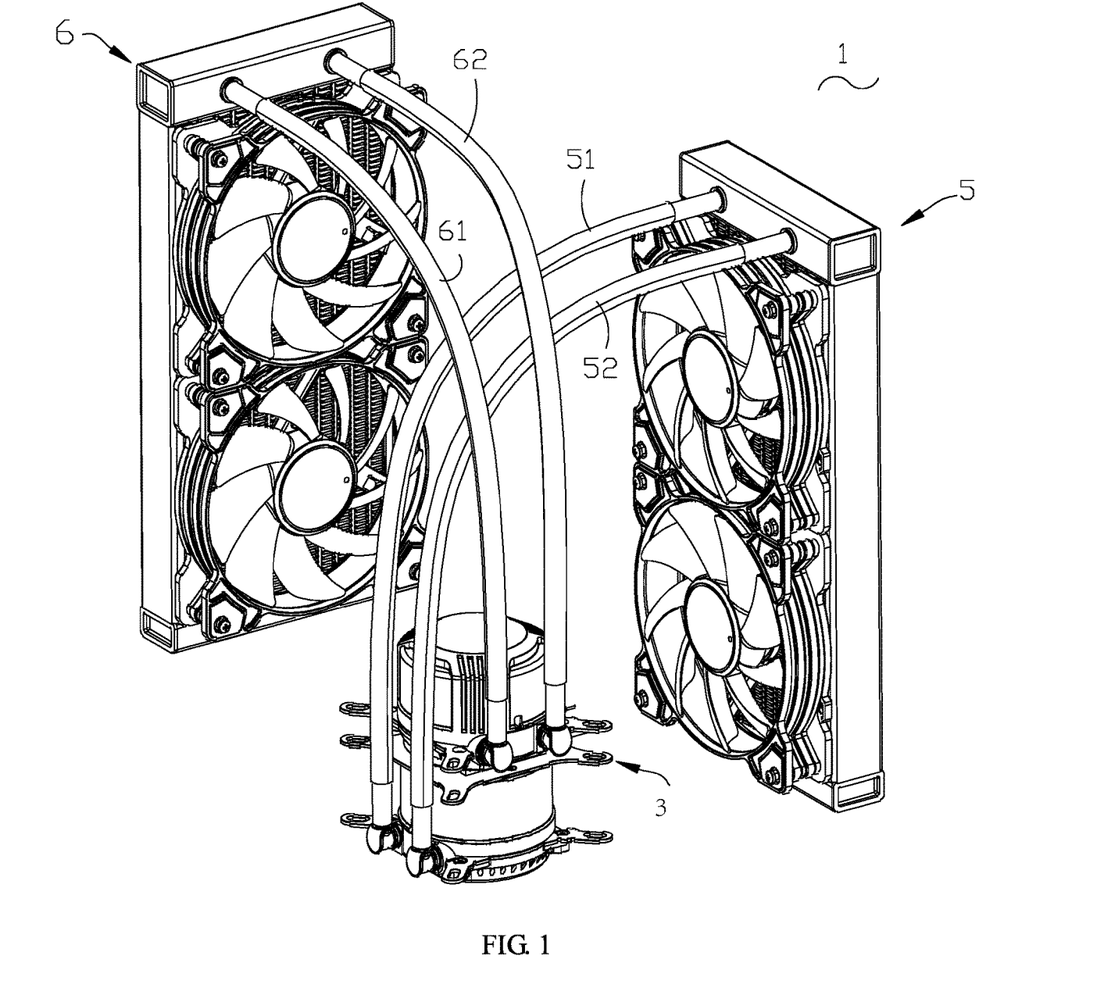
FIG. 1 is a perspective view of a water cooling radiator provided in an embodiment of the present disclosure.

FIGS. 1 and 2 show a water cooling radiator 1 provided in an embodiment of the present disclosure, which includes a water block device 3, a first heat exchanger 5 and a second heat exchanger 6. The first heat exchanger 5 is communicated with the circulating water path, and the second heat exchanger 6 is communicated with the flowing water path.

As a specific embodiment, the first heat exchanger 5 is provided with a first water inlet pipe 51 and a first water outlet pipe 52 communicated therewith. The first water inlet pipe 51 is connected to the first water inlet joint 135, and the first water outlet pipe 52 is connected to the first water outlet joint 100. The second water block 4 is provided with a second water inlet joint 42 and a second water outlet joint 43. The second heat exchanger 6 is provided with a second water inlet pipe 61 and a second water outlet pipe 62 communicated therewith. The second water inlet pipe 61 is communicated with the second water inlet joint, and the second water outlet pipe 62 is communicated with the second water outlet joint. The first heat exchanger 5 and the second heat exchanger 6 are both provided with a heat dissipation fan for dissipating heat therefrom.

The above descriptions are merely preferred embodiments of the present disclosure, and are not intended to limit the present disclosure. Any modification, equivalent substitution or improvement within the spirit and principles of the present disclosure should be included within the protection scope of the present disclosure.

What is claimed is:

1. A water block module, comprising a first water block and a refrigeration module arranged on the first water block, wherein the first water block is provided with a first heat source surface in contact with a processor and a cold source surface in contact with the refrigeration module, and a circulating water path is arranged in the first water block for circulating flow of external refrigeration liquid from the first heat source surface to the cold source surface so as to reduce the temperature of refrigeration liquid in the circulating water path,
wherein the first water block comprises a central bracket, and a first water pump and a second water pump rotatably connected to the central bracket, the first water pump is configured to make the external refrigeration liquid flow from the first heat source surface to the cold source surface along the circulating water path, and the second water pump is configured to output the refrigeration liquid in the circulating water path to the outside of the first water block.

2. The water block module of claim 1, wherein the central bracket is provided with an accommodating cavity, the central bracket comprises a separation bracket, the separation bracket is arranged in the accommodating cavity for separating the accommodating cavity into a first cavity and a second cavity, the first cavity is configured to accommodate the first water pump, the second cavity is configured to accommodate the second water pump, and the circulating water path transmits the refrigeration liquid flowing into the first cavity to the second cavity.

3. The water block module of claim 2, wherein the central bracket is provided with a water inlet bin and a first heat exchange module for closing the water inlet bin, the first heat exchange module is connected to the central bracket, the water inlet bin is communicated with the first cavity, the first heat source surface is arranged on a side of the first heat exchange module facing away from the central bracket, and the first heat source surface is configured to abut against the processor.

4. The water block module of claim 3, wherein the central bracket is further provided with a flowing bin communicated with the first cavity and a second heat exchange module for closing the flowing bin, the second heat exchange module is connected to the central bracket, the cold source surface is arranged on a side of the second heat exchange module away from the central bracket, and the refrigeration module abuts against the cold source surface.

5. The water block module of claim 2, wherein the central bracket is further provided with a first water outlet for communicating the second cavity and the flowing bin, the first water outlet is located in the flowing bin, and the central bracket is provided with a second water outlet communicated with the second cavity for outputting the refrigeration liquid in the first water block to the outside of the first water block.

6. A water block device, comprising the water block module of claim 1 and a second water block connected to the water block module, wherein the second water block comprises a second heat source surface, the refrigeration module comprises a hot surface and a cold surface abutting against the cold source surface, and the second heat source surface abuts against the hot surface for dissipating heat from the hot surface.

7. The water block device of claim 6, wherein the second water block is provided therein with a flowing water path through which refrigeration liquid in the second water block flows, and the flowing water path and the circulating water path are connected in series or in parallel.

8. A water cooling radiator, comprising the water block device of claim 6, a first water heat exchanger and a second water heat exchanger, wherein the first water heat exchanger is communicated with the circulating water path, and the second water heat exchanger is communicated with a flowing water path.

9. The water cooling radiator of claim 8, wherein the second water block is provided therein with the flowing water path through which refrigeration liquid in the second water block flows, and the flowing water path and the circulating water path are connected in series or in parallel.

* * * * *